ELECTRO-OPTICAL TRANSISTOR SWITCHING DEVICE

Filed Nov. 29, 1963 2 Sheets-Sheet 1

JAMES R. BIARD,
EDWARD L. BONIN,
JACK S. KILBY,
GARY E. PITTMAN
INVENTORS

BY John G. Graham
ATTORNEY

JAMES R. BIARD,
EDWARD L. BONIN,
JACK S. KILBY,
GARY E. PITTMAN
INVENTORS

BY John G. Graham

ATTORNEY 3,413,480

ELECTRO-OPTICAL TRANSISTOR SWITCHING DEVICE

James R. Biard and Edward L. Bonin, Richardson, and Jack S. Kilby and Gary E. Pittman, Dallas, Tex., assignors to Texas Instruments Incorporated, Dallas, Tex., a corporation of Delaware Filed Nov. 29, 1963, Ser. No. 327,136
4 Claims. (Cl. 250—211)

The present invention relates generally to a device for providing interstage coupling between electrical circuits which are completely electrically isolated from each other. More particularly, it relates to an electro-optical device having a pair of input terminals and a pair of output terminals electrically isolated therefrom, in which a solid-state, semiconductor light source generates optical radiation in response to an input signal for controlling the electrical characteristics at the output in response to said optical radiation. The device has utility either as a sold-state switch in which the output terminals are open or short circuited in response to the non-existence or existence of a signal at the input terminals, or in which the current through the output terminals is a linear function of the input signal.

Many attempts have been made for providing intercoupling devices between various circuits which are completely electrically isolated from each other, of which a common example is the isolation transformer for alternating current applications. However, isolation transformers are not characterized by complete electrical isolation between the input and output terminals because of magnetic pick-up and spike feed-through, which is a result of winding capacitance. In addition, they are unsuitable for direct current applications. Moreover, the present trend of electronics is to provide miniaturized circuits which almost exclusively incorporate so-called solid-state components. It is obvious that devices such as the expensive and bulky isolation transformer are wholly unsuitable for this application. Since simplicity in electrical design is of primary concern in all circuit applications including miniature circuits, further attempts have been made to provide intercoupling devices of this nature which have included, among other things, the use of optical coupling concepts to achieve the desired electrical isolation. Until the present invention, however, there had not been designed a suitable device of this nature which was efficient enough to be considered as a useful device. At least one major disadvantage of conventional devices or systems using optical coupling techniques to achieve electrical isolation is the fact that the light had to be modulated by mechanical choppers to achieve A.C. operations, which is low frequency at best.

In order to show the need of an intercircuit coupling device and the characteristics which it is required to possess, momentary reference will be had to the various applications of the semiconductor transistor, which is used extensively as a switch in electronic circuitry, especially in the field of logic application. In performing logic operations with transistor switches, it would be desirable, in many cases, to provide a logic block wherein a plurality of such switches are connected in series or parallel fashion or both and as many inputs to the logic block are provided as there are switches. The number of inputs is commonly referred to as the degree of fan-in, such as a fan-in of three when there are three inputs. Unfortunately, a very large fan-in cannot be achieved in such cases using conventional circuitry. For example, connecting a plurality of transistor switches in series and providing an input to each transistor to achieve an "AND" function requires a successively greater input voltage signal to each successive transistor in order to obtain sufficient driving current to turn it on. The reason for this is the fact that the transistors are connected in series to a reference potential and the driving source for each transistor is also referred to the same reference potential. Another limitation resulting from having a common reference potential for an entire logic block or logic section is that circulatory ground currents produce spurious voltages that are of the same order of magnitude of the logic signals, which increases the percentage of errors and erroneous switching in logic circuitry. Thus, logic circuitry connections are greatly limited by the fact that complete electrical isolation is not achieved between various stages and components of the circuits. Thus, it can be seen that an interstage coupling device which is equivalent to a switch would be of prime importance in circuit applications of this nature wherein the control terminals for actuating the switch are completely electrically isolated from the switching element. Such a device would be analogous to a single-pole, single throw switch and a relay for actuating the switch without magnetic coupling effects.

The foregoing is but one application for the interstage coupling device under consideration. In other applications it may be desirable that the current through the output terminals of the coupling device be linearly related to an input signal thereto. The present invention provides an intercoupling device that has utility as an open-close switch, or which can be used as a linear coupling device, and comprises a photosensitive semiconductor junction device which is optically coupled to a solid-state, semiconductor light source. The light source contains a rectifying junction and generates optical radiation when a forward current bias is caused to flow across the junction. The photosensitive device responds to the optical radiation and functions as an active device by reason of its rectifying junction, as contrasted to a photoconductive resistance device whose conductivity varies ideally in direct proportion to light intensity.

In its preferred embodiment, the invention comprises a coupling device having completely electrically isolated input and output terminals, and utilizes a photosensitive transistor as a detector or switching element which is caused to conduct in response to optical radiation. A solid-state, semiconductor junction diode that emits light of a characteristic wavelength when a forward bias is caused to flow across the junction thereof is optically coupled to the transistor and is used as the driving source for operating the switch, wherein the generated optical radiation has a photon energy greater than the band gap energy of the particular semiconductor material from which the photosensitive semiconductor junction detector device is fabricated, as will be described hereinafter. Thus, complete electrical isolation is achieved between the pair of input terminals, across which an input signal is applied to actuate the switch, and the output terminals. Moreover, because of the solid-state nature of the diode light source, the switch can be made economically and of very small dimensions. The intensity of the light emitted by the diode can be modulated at an extremely high frequency by the application to its input terminals of a high frequency series of pulses. Thus, fast switching action can be achieved in the switch for applications to fast logic circuitry. Because of the nature of the solid-state light source, in which a forward current bias causes the generation of optical radiation, and the characteristic junction effect of the detector, the over-all efficiency of the coupling device is large enough to be of primary significance as a means of providing simplicity and versatility in numerous circuit applications. Because of the junction effect of the detector, the device can be operated as switch or as a linear intercoupling element.

Other objects, features and advantages will become apparent from the following detailed description when taken in conjunction with the appended claims and the attached drawing wherein like reference numerals refer to like parts throughout the several figures, and in which:

Figure 3:
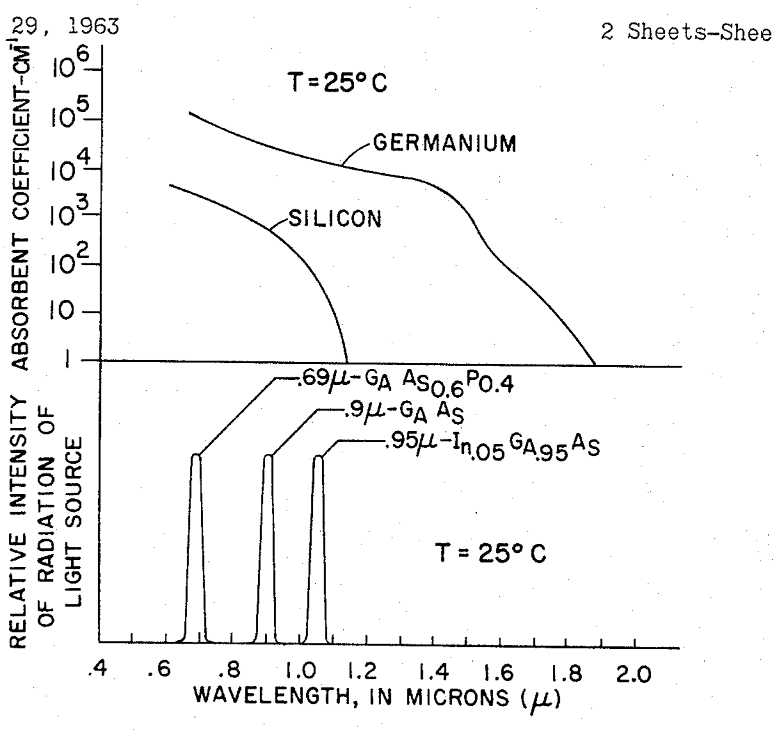
Figure 4:
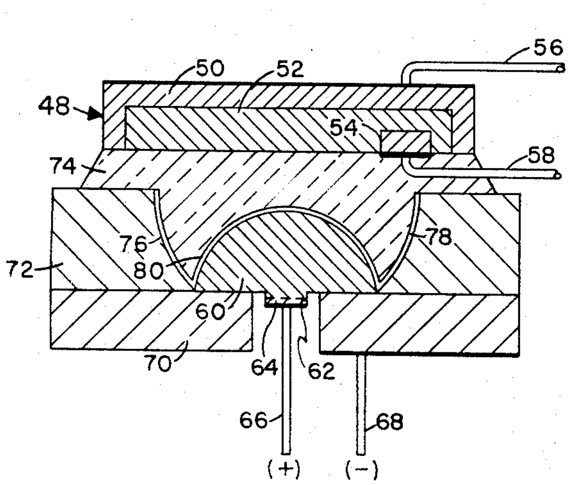
Figure 5:
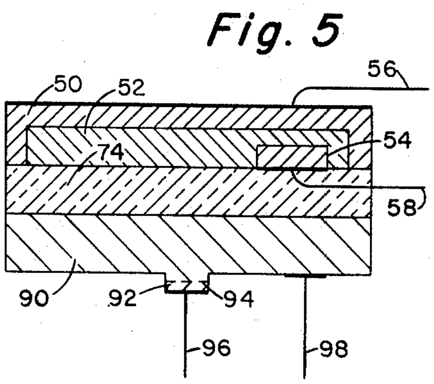

FIGURE 3 are graphical illustrations showing the relative coefficient of absorption of optical radiation as a function of wavelength for the semiconductor materials silicon and germanium as compared to the relative intensity of optical radiation as a function of wavelength for three different light emitting diodes comprised of gallium-arsenide-phosphide ($GaAs_{0.6}P_{0.4}$), gallium-arsenide (GaAs), and indium-gallium-arsenide ($In_{.05}Ga_{.95}As$), respectively;

FIGURE 4 is an elevational view in section of one embodiment of the invention; and FIGURE 5 is an elevational view in section of another embodiment of the invention.

Figure 1:
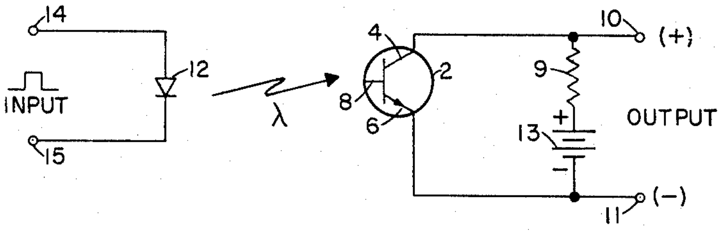
FIGURE 1 is an electrical schematic diagram of a preferred embodiment of the invention.

Referring now to FIGURE 1, there is shown a photosensitive transistor 2 of the n-p-n variety optically coupled to a light emitting, semiconductor junction diode 12. The transistor includes a collector region 4, base region 8 and an emitter region 6, wherein output terminals 10 and 11 are connected to the collector and emitter, respectively, and input terminals 14 and 15 are connected to the anode and cathode of the diode, respectively. The output terminals are connected into a circuit in which the transistor acts as an active element therein, and in which there is provided a potential source to supply a collector to emitter voltage to the transistor. This is shown schematically in FIGURE 1 as a load resistance 9 and potential source 13. The input terminals are connected into another circuit (not shown) which is completely electrically isolated from the output circuit. That is, the two circuits are not referred to the same reference potential source. The transistor, because of its semiconductor properties, is also photosensitive in that light of a suitable wavelength, when absobed by the transistor bulk, will create hole-electron pairs. These charge carriers, when collected at one or both of the junctions, cause the emitter-base junction to become forward biased and the transistor to conduct. The semiconductor junction diode 12, which is optically coupled to the transistor, generates optical radiation or light of a characteristic wavelength when a forward current bias is caused to flow across its junction. For purposes of the present invention, the terms light and optical radiation are used interchangeably and are defined to include electromagnetic radiation in the wavelength region from the near infrared into the visible spectrum. The diode is forward biased when the anode 14 is positive with respect to the cathode 15, such as by the application of a positive pulse between the input terminals. The base 8 of the transistor is left "floating," since the device of the invention uses optical radiation for generating the necessary bits for turning the transistor on. Thus, application of a D.C. voltage or a forward biasing current to input terminals 14 and 15 causes the diode 12 to emit radiation which creates the necessary bias for causing the transistor to conduct. By applying a series of voltage pulses to the input terminals, the transistor can be turned on and off a a high frequency rate. Since the diode is a semiconductor device, the entire system can be made very small for miniature circuit applications. Moreover, the nature of the semiconductor diode is such as to make possible the provision of a source of light the intensity of which can be modulated at an extremely high frequency, which provides extremely fast switching action of the transistor.

Figure 2:
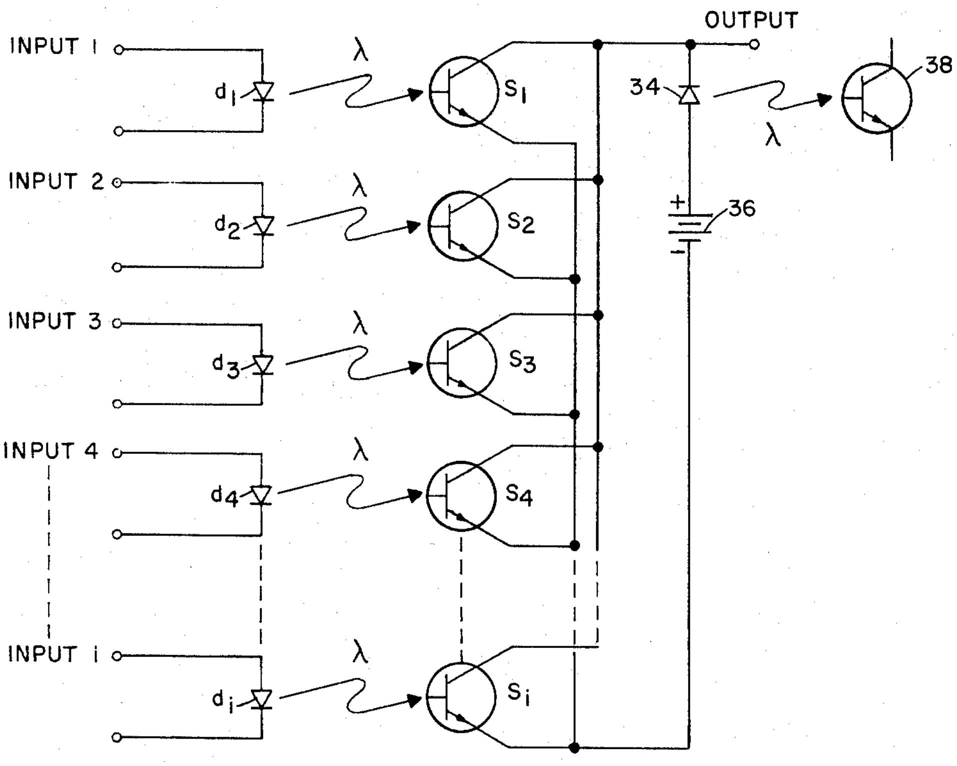
FIGURE 2 is an electrical schematic diagram illustrating the application of the invention to digital circuitry.

There is shown in the electrical schematic diagram of FIGURE 2 an example of the application of the electro-optical device of the invention to digital circuitry, wherein a plurality of photosensitive transistors $s_1$, $s_2$, $s_3$, $s_4$ . . . $s_i$ are connected with their respective emitters and collectors in parallel and are optically coupled to an equal number of light emitting diodes $d_1$, $d_2$, $d_3$, $d_4$ . . . $d_i$ to form a logic block. The collectors of the transistors are commonly connected to a source of positive potential 36 through another light emitting diode 34, and the emitters are commonly connected to the negative terminal of the potential source. The diode 34 is optically coupled to another photosensitive transistor 38 and drives the latter when a forward current is passed therethrough Separate inputs are provided to each of the first-mentioned light emitting diodes. The output of the logic block is across the load or diode 34, which, as noted, is used to drive another switch or light emitting diode when at least one of the transistors is conducting. A particular transistor switch is closed or made to conduct when an input signal exists at one of the inputs to the diodes. Thus, this particular logic block performs an OR function. Other functions can obviously be performed, such as the AND, NOR and NAND functions, by appropriate electrical connections and arrangements between the various components, and it is to be understood that the particular logic block shown in FIGURE 2 is for illustrative purposes only. In any case, it can be seen that complete electrical isolation is achieved within a logic block, or between various logic blocks, wherein the electro-optical switch shown in FIGURE 1 can be considered a sub-logic element within the block when used for this purpose. The electrical isolation obviously gives the designer versatility in a wide freedom in electrical connections, since the various stages of the circuit do not have to be referred to the same reference potential source.

The particular region of its characteristic curves in which the transistor is caused to conduct depends upon the circuit application. In the logic circuits just described, the photosensitive transistor acts as a switch and the diode acts as the means for actuating the switch, with complete electrical isolation therebetween. Thus, the transistor should be as nearly equivalent to a short circuit as possible when it is conducting, which corresponds to the saturation region of conduction. However, logic circuits require fast switching action, and, therefore, the transistor is caused to conduct just at the edge of the saturation region. If it is caused to conduct hard in the saturation region, however, the speed of the switch will be slower. To cause the transistor to conduct in the proper region, the over-all efficiency of the device is determined as described hereinafter, and only the intensity of optical radiation necessary for this particular conduction is generated by the light emitting diode, which is controlled by the amount of current caused to flow across the junction of the diode. Moreover, an over-all current gain of unity is all that is required of the intercoupling device for logic circuitry, which is defined as a current flow through the output terminals equal to the current flow through the input terminals.

In other applications, it may be desirable to use the coupling device as a linear circuit element, in which case the photosensitive transistor is caused to conduct in its linear operating region, namely the region between nonconduction and saturation. Thus, the output current will be linearly related to the intensity of optical radiation from the diode, which is a function of the input current.

A light emitting junction diode comprised of GaAs, is described in the co-pending application of Biard et al., entitled Semiconductor Device, Ser. No. 215,642, filed Aug. 8, 1962, assigned to the same assignee, and is an example of a suitable solid-state light source such as diode 12 of FIGURE 1. As will be described hereinafter in more detail, the diode can be comprised of other semiconductor materials to produce optical radiation of different wavelengths. As described in the above co-pending application, the diode comprises a body of semiconductor material, which contains a p-n rectifying junction. A forward current bias, when caused to flow through the junction, causes the migration of holes and electrons across the junction, and recombination of electron-hole pairs results in the generation of optical radiation having a characteristic wavelength or photon energy approximately equal to the band gap energy of the particular semiconductor material from which the diode is fabricated. It will be noted from the above co-pending application that the generation of optical radiation in the diode is caused by a forward current bias at the junction and is an efficient solid-state light source as contrasted to light generated by other mechanisms, such as reverse biasing the junction, avalanche processes, and so forth. The relative intensity of radiation as a function of wavelength for optical radiating generated by a gallium-arsenide p-n junction diode is shown in the lower graph of FIGURE 3, where it can be seen that the radiation intensity is greatest at a wavelength of .9 micron. A typical curve of the relative coefficient of absorption of light as a function of wavelength for silicon and germanium are shown in the upper graph of FIGURE 3, where it can be seen that the .9 micron wavelength radiation generated by a gallium-arsenide diode will be absorbed by a body comprised either of silicon or germanium. Similar curves are shown for light generated by diodes comprised of gallium-arsenide-phosphide, $Ga(As_{0.6}P_{0.4})$, and indium-gallium-arsenide $$(In_{.05}Ga_{.95}As)$$

where it can be seen again that either a germanium or silicon body will absorb the light of wavelengths of .69 micron and 0.95 micron, respectively. These compositions are enumerated as examples only, and other useful compositions will be described below. It will also be noted from the graphs of absorption coefficients that before any appreciable absorption occurs in silicon or germanium, the photon energy must be at least slightly greater than the band gap energies of silicon and germanium, respectviely. The band gap energies for silicon and germanium are 1.04 ev. and .63 ev., respectively. The graphs of FIGURE 3 show that absorption begins in silicon at a wavelength of about 1.15 micron, which corresponds to a photon energy of about 1.07 ev., and increases with shorter wavelengths; and absorption begins in germanium at about 1.96 micron. which corresponds to a photon energy of about .64 ev., and increases with shorter wavelengths. These two energies are greater than the respective band gap energies of the two materials, which clearly indicates the band-to-band transitions of electrons upon absorption, which is the type absorption with which the invention is concerned.

Since the optical radiation generated by the diode must be absorbed by the photosensitive transistor switch in such a manner to cause the transistor to conduct, it is important to consider in more detail the absorption phenomenon which will more clearly illustrate the invention and its advantages. It can be seen from FIGURE 3 that the coefficient of absorption of light is less for longer wavelengths and, therefore, penetrates to a greater depth in a body of semiconductor material before being absorbed than does light of shorter wavelengths. When the light is absorbed in the transistor and generates charge carriers, the carriers, which are holes and electrons, must diffuse to one of the junction regions within the transistor in order to produce a bias to cause the transistor to conduct. In other words, the invention is not concerned with the photoconductive effect within the material of the detector, but a junction effect, wherein the characteristics of the junction are altered when current carriers created by absorption of photons are collected at the junction. Since the transistor conducts on a minority carrier flow within the base region, the light must be absorbed in the transistor within the diffusion length of the minority carriers produced thereby from one or both of the junctions. For longer wavelength light, the junction at which the carriers are collected must be at a relatively large depth below the surface of the transistor in order that the majority of carriers produced by the light be collected. In other words, more depth of material is required before all of the light impinging on the surface of the transistor is absorbed, although a percentage of the light will be absorbed in each successive unit thickness of the transistor. Thus, the region over which the light is absorbed is relatively wide, and in order to insure the efficient collection at the junction of the majority of charge carriers generated thereby, relatively high lifetime material is used in the transistor bulk. However, high lifetime material increases the time of travel of the charge carriers from their point of origination to the junction, therefore decreasing the speed at which the transistor is turned on by the light. Conversely, by using optical radiation of shorter wavelength, the junction depth and lifetime of the semiconductor material can be correspondingly decreased without decreasing the collection efficiency, such as by the use of a light emitting diode comprised of $GaAs_{0.6}P_{0.4}$, for example.

A side elevational view in section of one embodiment of the invention is shown in FIGURE 4, which comprises a diffused, photosensitive transistor 48 of planar construction and a semiconductor junction diode optically coupled thereto. The transistor is comprised of semiconductor material such as germanium or silicon, and is of either the n-p-n or p-n-p variety. There is also shown in FIGURE 4 a suitable structure for mounting the components of the electro-optical switch to provide the necessary optical coupling between the switch and the driving source. The light emitting junction diode comprises a hemispherical conductor region 60 of a first conductivity type and a smaller region 62 of an opposite conductivity type contiguous therewith. An electrical connection 66 is made to the region 62 and constitutes the anode of the junction diode, and the flat side of the region 60 is mounted in electrical connection with a metallic plate 70 with the region 62 and lead 66 extending into and through a hole in the plate. An electrical lead 68 is provided to the metallic plate 70 and constitutes the cathode of the diode. The diode is fabricated by any suitable process, such as, for example, by the diffusion process described in the above co-pending application or by an epitaxial process, to be described hereinafter, and contains a p-n rectifying junction 64 at or near the boundary between the regions 60 and 62.

The photosensitive transistor 48 comprises a semiconductor wafer 50 of a first conductivity type used as the collector into which an impurity of the opposite conductivity determining type is diffused to form a circular base region 52. An impurity of the same conductivity determining type as the original wafer 50 is diffused into the base region to form an emitter region 54 of relatively small area. The transistor shown is of planar construction and is designed to have a relatively high forward current gain, $h_{FE}$, with which those skilled in the art are familiar. An electrical connection is made to collector region 50 by means of a wire 56, and another electrical connection is made to the emitter region 54 by means of wire 58. The base region 52 is left "floating" without an external electrical connection thereto, since the driving source for causing the transistor to conduct is effected by means of the optical radiation from the junction diode.

Another plate 72 is mounted about the diode and defines a hemispherical reflector surface 76 about the hemispherical dome 60. The photosensitive transistor 48 is mounted above the hemispherical dome with the emitter 54 and base 52 facing the dome. A light transmitting medium 74 is used to fill the region between the reflector and the dome and for mounting the transistor above the dome, wherein the light transmitting medium acts as a cement to hold the components together. Ample space is provided between the top of the reflector plate 72 and the transistor for passing the lead 58 from the emitter region 54 out of the region of the dome without being shorted to either the transistor or the reflector plate. The lead is held in place by the cement-like transmitting medium.

When a forward bias current is passed through the junction of the radiant diode between the anode 66 and the cathode 68, light is emitted at the junction, travels through the dome 60 and the light transmitting medium 74 and strikes the surface of the transistor, where it is principally absorbed in the region of the collector-base junction to cause the transistor to conduct.

The hemispherical dome structure is preferably used in order to realize the highest possible quantum efficiency. If the proper ratio of the radius of the junction 64 to the radius of the hemispherical dome is selected, then all of the internally generated light that reaches the surface of the dome has an angle of incidence less than the critical angle and can be transmitted. The maximum radius of the diode junction with respect to the dome radius depends on the refractive index of the coupling medium, and since all of the light strikes the dome surface close to the normal, a quarter wavelength anti-reflection coating will almost completely eliminate reflection at the dome surface. The maximum radius of the diode junction to the dome radius is determined by computing the ratio of the index of refraction of the coupling medium to the index of refraction of the dome material. The dome, as shown in FIGURE 4, has a quarter wavelength anti-reflection coating 80 thereon comprised of zinc-sulfide to eliminate any possible reflection. A true hemispherical dome is optimum, because it gives the least bulk absorption to all spherical segments which radiate into a solid angle of $2\pi$ steradians or less. Spherical segments with height greater than their radius radiate into a solid angle less than $2\pi$ steradians, but have higher bulk absorption. Spherical segments with height less than either radius have less absorption but emit into a solid angle greater than $2\pi$ steradians and, therefore, direct a portion of the radiation away from the detector. Due to the presence of bulk absorption, the dome radius should be as small as possible to further increase the quantum efficiency of the unit.

The photosensitive transistor has a radius of about 1.5 times the radius of the hemispherical dome, which allows all the light emitted by the dome to be directed toward the detector by the use of a simple spherical reflecting surface 76. Since most of the light from the hemispherical domes strikes the transistor surface at high angles of incidence, an anti-reflection coating on the detector is not essential and can be considered optional. The light transmitting medium 74 between the dome and the transistor should have an index of refraction high enough with respect to the indices of refraction of the dome and the transistor to reduce internal reflections, and to allow the ratio of the junction radius of the diode to the dome radius to be increased. The medium should also "wet" the surfaces of the source and the detector so that there are no voids which would destroy the effectiveness of the coupling medium. The indices of refraction of the diode and the silicon transistor are each about 3.6. A resin such as Sylgard, which is a trade name of the Dow Corning Corporation of Midland, Mich., has an index of refraction of about 1.43 and is suitable for use as the light transmitting medium. Although this index is considerably lower than 3.6, it is difficult to find a "transparent" substance that serves this purpose with a higher index and which has the required mechanical characteristics. In order to insure the highest reflectivity, the reflector surface 76 is provided with a gold mirror 78 which can be deposited by plating, evaporation, or any other suitable process.

The metallic plates 70 and 72 are preferably comprised of a metal or alloy having the same or similar coefficient of thermal expansion as the junction diode, such as Kovar, for example. Similarly, the coupling medium 74 preferably has the same or similar coefficient of thermal expansion, or alternately remain pliable over a wide, useful temperature range of normal operation. Again, Sylgard satisfies this requirement by being pliable.

Various compositions of the light emitting diode and photosensitive transistor have been mentioned in conjunction with the graphs of FIGURE 3, wherein the preferred compositions depend upon several factors including the absorption coefficient of the photosensitive transistor, the ultimate efficiency to be achieved from the diode, and other factors as will be pressently described. One factor to be considered is the speed of response of the photosensitive transistor to the optical radiation, wherein it has been seen that light of shorter wavelength gives a faster switching time because of the greater coefficient of absorption of the detector. This factor, if considered by itself, would indicate that a diode comprised of a material which generates the shortest possible wavelength is preferred. However, the efficiency of the light source must also be considered, in which the over-all efficiency can be defined as the ratio of the number of photons of light emerging from the dome to the number of electrons of current to the input of the diode, and the internal efficiency is the ratio of the number of photons of light generated in the diode to the number of input electrons.

It was pointed out in the above co-pending application that, in most cases, less of the light generated internally in the diode is absorbed per unit distance in the n-type region than in the p-type region. Moreover, n-type material can normally be made of higher conductivity than p-type material of the same impurity concentration. Thus, the dome is preferably of n-type conductivity material. In addition to this factor, it has been found that the greater the band gap of the material in which the light is generated, the shorter the wavelength of the light, wherein the frequency of the generated light is about equal to or slightly less than the frequency separation of the band gap. It has further been found that the light is absorbed to some extent in the material in which it is generated or in a material of equal or less band gap width, but is readily transmitted through a material having a band gap width at least slightly greater than the material in which the light is generated. In fact, a sharp distinction is observed between the efficient transmission of light through a composition whose band gap is slightly greater than the composition in which the light is generated, and through a composition having a band gap equal to or less than that of the generating composition. This implies that the light is readily transmitted through a material the frequency separation of the band gap of which is greater than the frequency of the generated light.

To take advantage of this knowledge, the light emitting diode, in the preferred embodiment, is comprised of two different compositions in which the junction at or near which the light is generated is located in a first region of the diode comprised of a material having a first band gap width and of p-type conductivity, and in which at least the major portion of the dome is comprised of a second material having a second band gap width greater than the first material and is of n-type conductivity. Thus, light generated in the first material has a wavelength which is long enough to be efficiently transmitted through the dome. There are several materials that have been found to be internally efficient light generators when a forward current is passed through a junction located therein, in addition to Ga As noted in the above co-pending application. The material indium-arsenide, In As, has a band gap width of about .33 ev. and, if a p-n junction is formed therein, will generate light having a wavelength of about 3.8 microns, whereas light from Ga As is about .9 micron. The compositions $In_x Ga_{1-x} As$, where $x$ can go from 0 to 1, give off light of wavelength which varies approximately linearly with $x$ between 3.8 microns for In As when $x=1$ to .9 micron for Ga As when $x=0$. On the other side of Ga As is the composition gallium phosphide, GaP, which has a band gap of about 2.25 ev. and emits radiation of about .5 micron. Also, the compositions $Ga As_x P_{1-x}$, where $x$ can go from 0 to 1, give off light of wavelength which varies approximately linearly with $x$ between .9 micron for Ga As when $x=1$ to .5 micron for GaP when $x=0$. It has been found, however, that for various reasons, the internal efficiency of light generation begins to drop off when the band gap of the material used is as high as about 1.8 ev., which approximately corresponds to the composition Ga $As_{0.6}$ $P_{0.4}$, or for $x$ equal to or less than about 0.6 for the compositions Ga $As_x$ $P_{1-x}$.

Referring again to the FIGURE 4 and more specifically to the construction of the light emitting diode, a preferred embodiment compirses a dome 60 of n-type conductivity material with a smaller region 62 contiguous therewith in which a portion is of p-type conductivity. The region 62 is comprised of a composition having a first band gap width, and the dome 60 is comprised of a region having a second band gap width greater than that of region 62. The rectifying junction 64 is formed in the region 62 of smaller band gap width so that the light generated herein will be efficiently transmitted through the dome. The portion of region 62 between the junction 64 and the dome is of n-type conductivity. Referring to the graphs of FIGURE 3 and the foregoing discussion, a preferred composition for the region 62 is one which will generate as short a wavelength as possible in order to have a high coefficient of absorption in the transistor for fast switching action, and yet which will be efficiently transmitted by the dome 60. At the same time, the composition of region 62 should have a high internal efficiency as a light generator. The composition Ga $As_{.6}$ $P_{.4}$ will efficiently produce light of wavelength of about .69 micron and constitutes the preferred material for the smaller region 62. By making the dome of a composition of band gap slightly greater than that of the region 62, such as $Ga_{.5}$ $As_{.5}$ P, for example, or for $x$ equal to or less than .5 for the compositions Ga $As_x$ $P_{1-x}$, the light will be efficiently transmitted. It should be noted that although the dome is comprised of a composition that does not have a high internal efficiency of light generation, this is unimportant, since the light is actually generated in the smaller region 62 of high efficiency. Thus, the dome material can be extended to compositions of relatively high band gap widths, even to GaP, without decreasing the over-all efficiency of the unit.

Other compositions and combinations thereof can be used, such as various combinations of $In_x$ $Ga_{1-x}$ As or Ga $As_x$ $P_{1-x}$, or both. In addition, most III–V compounds can be used, or any other material which generates light by a direct recombination process when a forward current is passed through a rectifying junction therein. Moreover, the entire light emitting diode can be comprised of a single composition such as, for example, Ga As described in the above co-pending aplication. It can, therefore, be seen how the compositions of the various components of the system can be varied to achieve various objectives, including the highest over-all efficiency of the entire system. Undoubtedly, other suitable compositions and combinations thereof will occur to those skilled in the art.

The light emitting diode can be made by any suitable process. For example, if two different compositions are used, a body or wafer constituted of a single crystal of one of the compositions can be used as a substrate onto which a single crystal layer of the other composition is deposited by an epitaxial method, which method is well known. Simultaneous with or subsequent to the epitaxial deposition, the rectifying junction can be formed in the proper composition, slightly removed from the boundary between the two, by the diffusion of an impurity that determines the opposite conductivity type of the composition. By etching away most of the composition containing the junction, the small region 62 can be formed. If the entire light emitting diode is comprised of a single composition, a simple diffusion process can be used to form the junction. The shape of the dome is formed by any suitable method, such as, for example, by grinding or polishing the region 62.

Another embodiment of the invention is shown in FIGURE 5, which is an elevational view in section of a planar constructed light emitting diode optically coupled to a transistor as shown in FIGURE 4. The light emitting diode comprises a wafer 90 of semiconductor material of a first conductivity type into which is diffused an impurity that determines the opposite conductivity type to form a region 92 of said opposite conductivity type separated from the wafer 90 by a rectifying junction 94. The wafer is etched to cut below the junction and from the small region 92. Alternatively, the region 92 can be formed by an epitaxial process. Electrical leads 96 and 98 are connected to the region 92 and wafer 90 as previously described.

The wafer 90 is not formed into a dome structure in this embodiment, but is left in a planar configuration and optically coupled to the detector, as shown, with a suitable coupling medium 74 as noted earlier. This embodiment is more expedient to fabricate, as can be readily seen, and thus is advantageous in this respect. As indicated above, the dome structure is used to realize a high quantum efficiency, since all of the internally generated light strikes the surface of the dome at less than the critical angle, and thus little, if any, light is lost to internal reflections within the dome. This is not necessarily the case in the planar embodiment of FIGURE 6, and in order to achieve a high quantum efficiency, the diameter of the apparent light emitting surface of wafer 90, assuming a circular geometry, can be made somewhat smaller than the combined diameters or lateral dimensions across the two emitters of the detector. The apparent light emitting surface of the diode is determined by the thickness of wafer 90, the area of the light emitting junction 94, and the critical angle for total internal reflection. The critical angle of reflection is determined by computing the arcsine of the ratio of the index of refraction of the coupling medium 74 to the index of refraction of the semiconductor wafer 90.

In the preceding discussions, it was noted that a coupling medium having a suitable index of refraction is preferably used between the light emitting diode and the detector. If such a medium is used, it should have a high index to match, as closely as possible, that of the two components between which it is situated. Materials other than Sylgard can also be used, such as a high index of refraction glass. However, it can prove expedient and desirable in certain cases to couple the two components together with air, where a physical coupling is either impractical or impossible, and such a system is deemed to be within the intention of the present invention.

Although the preferred embodiment of the light emitting diode contains the junction in the region 62 below the boundary between the two regions 60 and 62, the junction can also be formed at this boundary or actually within the dome region 60 should this be more expedient for one or more reasons. In the case where the entire diode is comprised of a single composition, for example, an equally efficient light emitter can be made by locating the junction other than as shown in the preferred embodiment.

Other modifications, substitutions and alternatives will undoubtedly occur that are deemed to fall within the scope of the present invention, which is intended to be limited only as defined in the appended claims.

What is claimed is:

1. An electro-optical coupling system comprising:

(a) a transistor comprised of a first semiconductor material having a collector region, a base region and an emitter region, (b) contacts connected to said collector region and said emitter region, (c) said transistor being characterized by the absorption of optical radiation incident thereon which has a photon energy greater than the band gap energy of said first semiconductor material for generating excess minority carriers therein and being responsive to said excess minority carriers to alter the characteristics of the collector-base and base-emitter junctions thereof when said optical radiation is absorbed within a minority carrier diffusion length from at least one of said collector-base and base-emitter junctions, (d) a light emitting semiconductor device electrically isolated from but optically coupled to said transistor and having a first region of one conductivity type and a second region of an opposite conductivity type contiguous to and forming a rectifying junction with said first region, said first region and a portion of said second region of said light emitting device are comprised of a second semiconductor material having a band gap energy greater than that of said first semiconductor material, and the rest of said second region is comprised of a third semiconductor material having a band gap energy greater than that of said second semiconductor material with said second region being disposed between said first region and said transistor, (e) said light emitting device being characterized by the generation of said optical radiation when a forward current is caused to flow through the rectifying junction thereof, (f) said optical radiation generated by said light emitting device being characterized by a photon energy greater than the band gap energy of said first semiconductor material in which at least a portion thereof is absorbed in said transistor within a minority carrier diffusion length from at least one of said collector-base and base-emitter junctions.

2. An electro-optical coupling system according to claim 1 wherein said second region defines a hemisphere facing said transistor with said rectifying junction of said light emitting device being substantally parallel to the base thereof.

3. An electro-optical coupling system according to claim 2 including reflecting surfaces disposed laterally about said hemisphere for directing said optical radiation on said surface of said transistor.

4. An electro-optical coupling system according to claim 1 wherein said rectifying junction of said light emitting device is located within a second semiconductor material selected from the group consisting of III–V compounds of the periodic table and mixed combinations thereof, and said first semiconductor material is selected from the group consisting of silicon and germanium.

References Cited

UNITED STATES PATENTS

| | | | |
|---|---|---|---|
| 2,861,165 | 11/1958 | Aigrain et al. | 313—108 |
| 3,028,500 | 4/1962 | Wallmark | 250—211 |
| 3,043,958 | 7/1962 | Diemer | 250—217 |
| 3,050,633 | 8/1962 | Loebner | 250—209 |
| 3,087,067 | 4/1964 | Nisbet et al. | 250—209 |
| 3,229,104 | 1/1966 | Rutz | 250—211 |

FOREIGN PATENTS

| | | |
|---|---|---|
| 864,263 | 3/1961 | Great Britain. |

OTHER REFERENCES

"Gate," by A. S. Athens, IBM Technical Disclosure Bulletin, vol. 4, No. 5, October 1961, p. 1.

"Infrared and Visible Light Emission From Forward-Biased P-N Junctions," by R. H. Rediker, Solid State Design, August 1963, pp. 19 and 20.

RALPH G. NILSON, *Primary Examiner.*

M. ABRAMSON, *Assistant Examiner.*